(12) United States Patent
Ivanov

(10) Patent No.: US 7,453,746 B2
(45) Date of Patent: Nov. 18, 2008

(54) RECONSTRUCTION OF SIGNAL TIMING IN INTEGRATED CIRCUITS

(75) Inventor: Ivan I. Ivanov, Munich (DE)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/677,429

(22) Filed: Feb. 21, 2007

(65) Prior Publication Data

US 2007/0133321 A1   Jun. 14, 2007

Related U.S. Application Data

(62) Division of application No. 10/921,435, filed on Aug. 19, 2004, now Pat. No. 7,289,378.

(30) Foreign Application Priority Data

Mar. 31, 2004   (DE) .................. 10 2004 015 868

(51) Int. Cl.
*G11C 7/00* (2006.01)
(52) U.S. Cl. ................ 365/194; 365/189.08; 365/233.1
(58) Field of Classification Search ................ 365/194, 365/189.05, 190, 198, 189.08, 233.1
See application file for complete search history.

(56) References Cited

U.S. PATENT DOCUMENTS

| | | | |
|---|---|---|---|
| 5,655,105 A | 8/1997 | McLaury | |
| 5,793,688 A | 8/1998 | McLaury | |
| 6,029,250 A | 2/2000 | Keeth | |
| 6,101,197 A | 8/2000 | Keeth et al. | |
| 6,111,812 A | 8/2000 | Gans et al. | |
| 6,130,856 A | 10/2000 | McLaury | |
| 6,269,451 B1 | 7/2001 | Mullarkey | |
| 6,271,682 B1 | 8/2001 | Lindsay | |
| 6,272,070 B1 | 8/2001 | Keeth et al. | |
| 6,297,998 B1 | 10/2001 | Van de Graaff et al. | |
| 6,304,511 B1 | 10/2001 | Gans et al. | |
| 6,317,381 B1 | 11/2001 | Gans et al. | |
| 6,327,196 B1 | 12/2001 | Mullarkey | |
| 6,378,079 B1 | 4/2002 | Mullarkey | |
| 6,430,697 B1 * | 8/2002 | Muljono | ...................... 713/600 |
| 6,438,043 B2 | 8/2002 | Gans et al. | |
| 6,445,624 B1 | 9/2002 | Janzen et al. | |

(Continued)

FOREIGN PATENT DOCUMENTS

DE   19616857   10/1996

*Primary Examiner*—Richard Elms
*Assistant Examiner*—Hien N Nguyen
(74) *Attorney, Agent, or Firm*—Leffert Jay & Polglaze, P.A.

(57) ABSTRACT

Improved integrated circuits, memory devices, circuitry, and data methods are described that facilitate the adjustment and reconstruction of signal timing of devices by providing for an interface having inputs and/or outputs that are adjustably delayed. This allows embodiments of the present invention to sense the signal delay and utilize adjustable input or output delays to correct the signal timing relationships such that correctly timed communication signals are received by the internal circuitry of the device. In one embodiment of the present invention, a register is utilized to adjust the timing delay of individual input and/or output signals for the device. This increases the robustness of the device and its resistance to communication or data corruption, allowing larger ranges of environmental conditions and input capacitances of systems or communication busses to be tolerated.

38 Claims, 9 Drawing Sheets

U.S. PATENT DOCUMENTS

| | | |
|---|---|---|
| 6,445,643 B2 | 9/2002 | Keeth et al. |
| 6,499,111 B2 | 12/2002 | Mullarkey |
| 6,512,709 B1 * | 1/2003 | Nakahara et al. ............ 365/200 |
| 6,587,804 B1 | 7/2003 | Johnson et al. |
| 6,605,969 B2 | 8/2003 | Mikhalev et al. |
| 6,618,829 B2 | 9/2003 | Pax et al. |
| 6,643,789 B2 | 11/2003 | Mullarkey |
| 6,687,185 B1 | 2/2004 | Keeth et al. |
| 6,704,881 B1 | 3/2004 | Li et al. |
| 6,801,989 B2 | 10/2004 | Johnson et al. |
| 6,812,760 B1 | 11/2004 | Kim et al. |
| 6,845,057 B2 * | 1/2005 | Widmer et al. ......... 365/230.03 |
| 6,909,653 B2 * | 6/2005 | Shimadu et al. ............. 365/203 |
| 2001/0014048 A1 | 8/2001 | Han |
| 2001/0027507 A1 | 10/2001 | Merritt |
| 2001/0031027 A1 | 10/2001 | Lindsay |
| 2001/0044888 A1 | 11/2001 | Li |
| 2002/0135409 A1 | 9/2002 | Gomm |
| 2002/0154550 A1 | 10/2002 | Ma et al. |

* cited by examiner

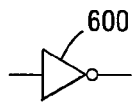
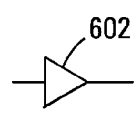
Fig. 6A          Fig. 6B
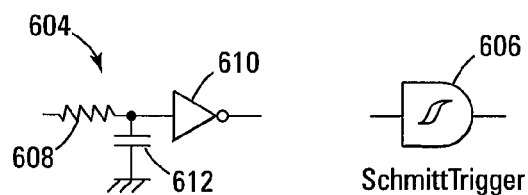
Fig. 6C          Fig. 6D
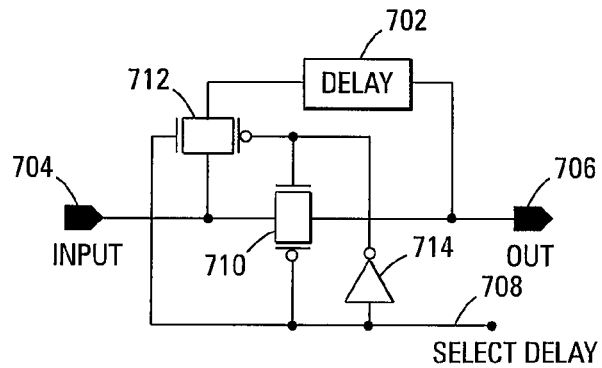
Fig. 7A
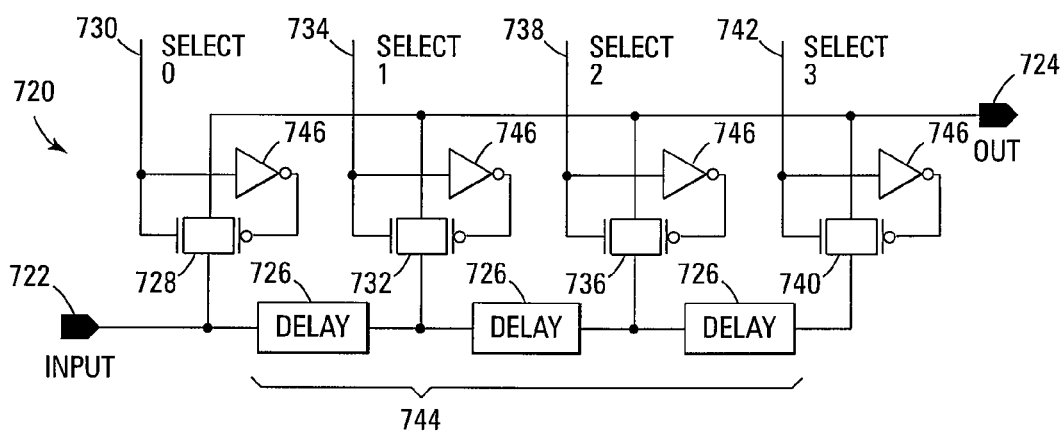
Fig. 7B

RECONSTRUCTION OF SIGNAL TIMING IN INTEGRATED CIRCUITS

CROSS-REFERENCE TO RELATED APPLICATION

This application is a Divisional of U.S. patent application Ser. No. 10/921,435, filed Aug. 19, 2004, now U.S. Pat. No. 7,289,378 and titled, "RECONSTRUCTION OF SIGNAL TIMING IN INTEGRATED CIRCUITS," which claims priority to German Patent Application Serial No. 10 2004 015 868.1, filed Mar. 31, 2004, entitled "RECONSTRUCTION OF SIGNAL TIMING IN INTEGRATED CIRCUITS," which is commonly assigned.

TECHNICAL FIELD OF THE INVENTION

The present invention relates generally to integrated circuits and in particular the present invention relates to signal timing of integrated circuits and memory devices.

BACKGROUND OF THE INVENTION

Integrated circuits are typically designed by their manufacturers to have signals occur in specified ranges of voltages and timings. These signal ranges are designed so as to operate and communicate in as wide range of systems and environments as possible. In many cases, during operation multiple signals on interfaces to the integrated circuit are utilized in coordinated signaling or communications where the signals utilized have a fixed timing relationship to each other. One type of integrated circuit that is designed to operate in a broad range of applications are memory devices.

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively. Other types of non-volatile memory include, but are not limited to, Polymer Memory, Ferroelectric Random Access Memory (FeRAM), Ovionics Unified Memory (OUM), and Magnetoresistive Random Access Memory (MRAM).

Yet another type of non-volatile memory is a Flash memory. A Flash memory is a type of EEPROM that is typically erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bitline) or a "NAND" architecture (cells coupled into "strings" of cells, such that each cell is coupled indirectly to a bitline and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

In operation, the interface of an integrated circuit or memory device is typically designed to operate in close signal timing relationships to communicate commands and data with the system or communication bus in which it is placed. If the timing relationship of the communication signals and control lines are not maintained, the data or command being communicated may fail or be corrupted. This is particularly the case in modem synchronous memory types which typically have very precise signal timings to allow for high speed data transfers.

Many conditions and environmental conditions can affect the communication environment and actual signal timing experienced by an integrated circuit or memory device operating in a system or communication bus. This includes, but is not limited to, the operating voltage levels, system layout, materials, temperature, and humidity. In particular, the capacitance experienced by an integrated circuit on its interface and control lines in a given system or communication bus can have a strong effect on the actual signal timing.

To deal with these variable signal conditions, as stated above, most integrated circuits and memory devices are designed by their manufacturers with a range of relative signal timings that they can accept. This provides a margin of error to avoid timing violations and allows for real world signal conditions. However, given the increased speed and timing demands of modern high speed memory devices and systems, the effect of real world environment and system conditions on signal timing has increased. Thus, the relative signal timing requirements of a given memory device is increasingly likely to be violated, increasing the likelihood of system errors and loss of data. Further complicating the issue is the fact that not all signals are affected the same, leading to one or more signal lines having more delay for a given memory device and system.

For the reasons stated above, and for other reasons stated below which will become apparent to those skilled in the art upon reading and understanding the present specification, there is a need in the art for improved signal timing adjustment apparatus and methods that can adjust for signal timing variances and allow for operation of integrated circuits and memory devices in a wide range of environments and systems.

BRIEF DESCRIPTION OF THE DRAWINGS

FIGS. 6A-6D detail signal delay elements of embodiments of the present invention.

FIGS. 7A-7C detail input delay circuits and delay adjustment register in accordance with embodiments of the present invention.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Integrated circuits, memory devices, control circuitry, or methods, in accordance with embodiments of the present invention, facilitate the adjustment and reconstruction of signal timing of devices by providing for an interface having inputs and/or outputs that are adjustably delayed. In particular, adjustably delayed interfaces for memory devices, such as Flash memory devices or Flash memory systems (Flash memory systems of two or more Flash memory devices coupled to a Flash memory controller which act as a single Flash memory device). This allows embodiments of the present invention to sense the signal delay and utilize adjustable input delays to correct the signal timing relationships such that correctly timed communication signals are received and/or transmitted by the internal circuitry of the device. In one embodiment of the present invention, a register is utilized to adjust the timing delay of individual input or output signal for the device. This increases the robustness of the device and its resistance to communication or data corruption, allowing larger ranges of environmental conditions and input capacitances of systems or communication busses to be tolerated.

Figure 1:
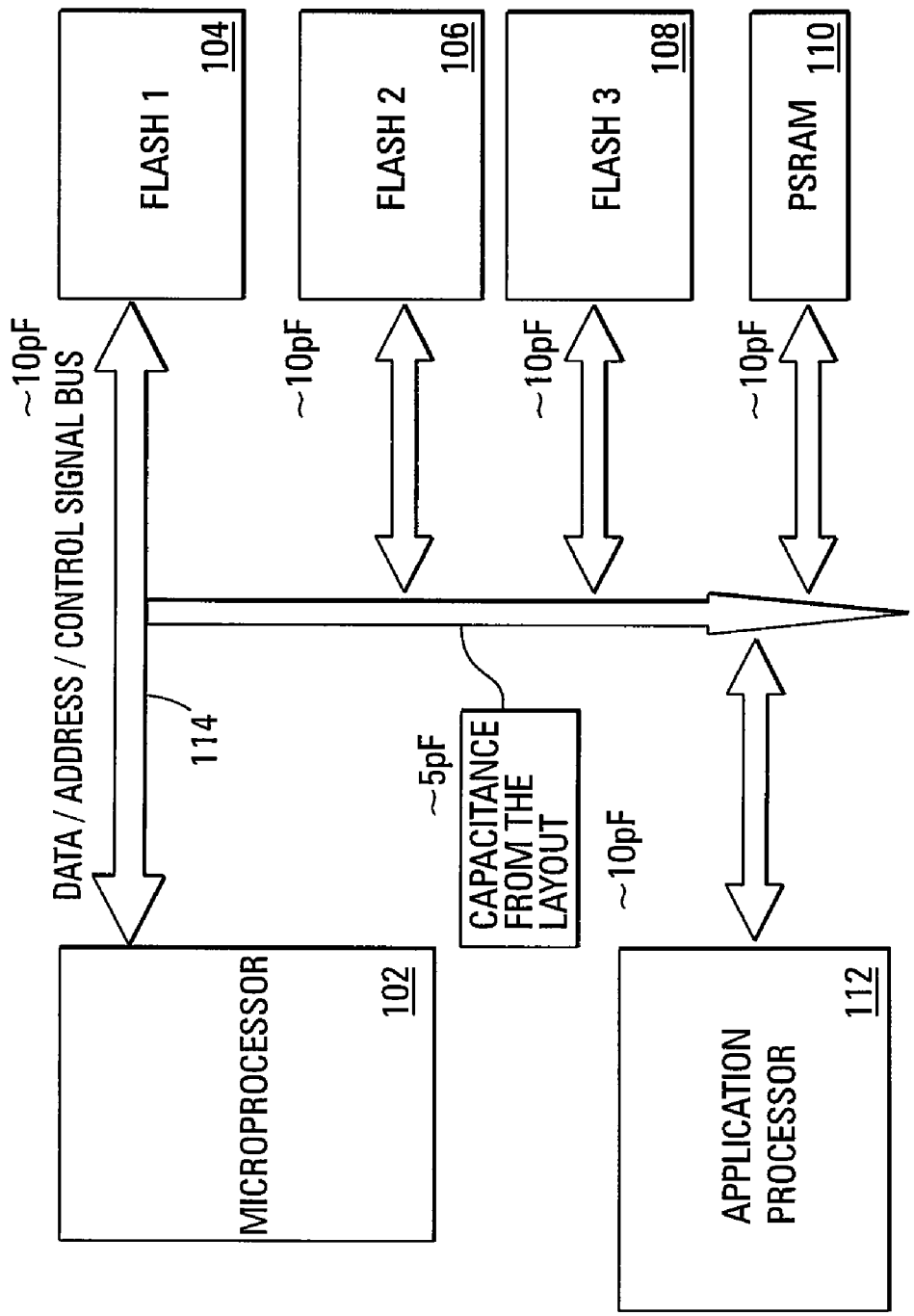
FIG. 1 details a system with Flash memory devices and capacitance effects.

FIG. 1 is a simplified diagram of a system 100 having one or more devices coupled to a communication bus 114. In the system 100 of FIG. 1, the communication bus 114 is coupled to a processor 102 and to multiple peripheral devices. The peripheral devices in FIG. 1 include, but are not limited to, Flash memory devices 104, 106, 108, a pseudo static RAM device (PSRAM) 110, and a peripheral application processor or application specific integrated circuit (ASIC) 112. The processor 102, via the communication bus 114, communicates with and controls the one or more peripheral devices, including the Flash memory devices 104, 106, and 108. The processor directs the operation of the peripheral devices coupled to it via the communication bus 114, sending and receiving commands, addresses, and data over the signal lines of the communication bus 114 to the interface of the currently selected peripheral device. It is noted that other peripheral devices, memory devices (including but not limited to, RAM memory devices, ROM memory devices, Flash memory devices, and Flash memory cards), and application specific devices are also possible to be coupled to the communication bus 114. It is also noted that the peripheral or memory devices may be indirectly coupled to the communication bus 114 through an interface circuit or controller, such as a Flash memory controller of a Flash memory card. It is noted that the processor 102 may also alternatively be a communication bus controller or a memory controller. It is further noted that other architectures of systems 100, interfaces, and manners of coupling the processor 102 to the peripheral devices, such as directly coupled individual busses and signal lines, are possible and should be apparent to those skilled in the art with benefit of the present disclosure.

Communication busses 114, such as that shown in the system 100 of FIG. 1, typically include multiple signal lines for communicating with their coupled processors 102 and peripheral devices. These signal lines can include but are not limited to address bus lines, data bus lines, combined address/data lines, and/or control lines. As noted above, multiple environmental conditions, such as operating voltage levels, system layout, materials, temperature, humidity, and capacitance can affect the relative timing of signals on the signal lines of the communication bus 114 and when they are received by an enabled peripheral, e.g., memory device 104, of the communication bus 114. As also stated above, the capacitance experienced by a memory device on its interface and control lines in a given system or communication bus can, in particular, have a strong effect on the actual signal timing. In FIG. 1, typical values of the capacitance effects due to various aspects of the system 100 and communication bus 114, such as the capacitance due to the interface/connection of each memory device, and the materials and layout of the communication bus, are listed. Each device added to the communication bus 114 adds to the total capacitance seen by the other devices on the communication bus 114. In addition, the capacitance and other delaying environmental factors are not uniform for each signal line in the communication bus 114, therefore the delay seen at the processor and peripheral device interfaces to the communication bus 114 are not uniform. Thus, different signal lines (control lines, address lines, or data lines) of the communication bus 114 will typically experience differing delays due to the specific capacitance and other specific environmental factors affecting the signal line. It is noted that the signal line delays seen by the devices coupled to a communication bus 114 are affected by the addition and/or subtraction of devices to the communication bus, so that the addition or/subtraction of devices to a communication bus 114 can have an impact on the signal timing and even correct operation of the system 100.

Integrated circuit and memory device embodiments of the present invention utilize adjustable delays on the inputs and/or outputs of their interfaces to facilitate the adjustment and reconstruction of signal timing and proper signal timing relationships. This is accomplished by adjustably delaying the signals to correct and restore signal timing relationships. This allows for proper operation of the integrated circuit or memory device in a wide range of applications with differing environments and signal delays.

Figure 2:
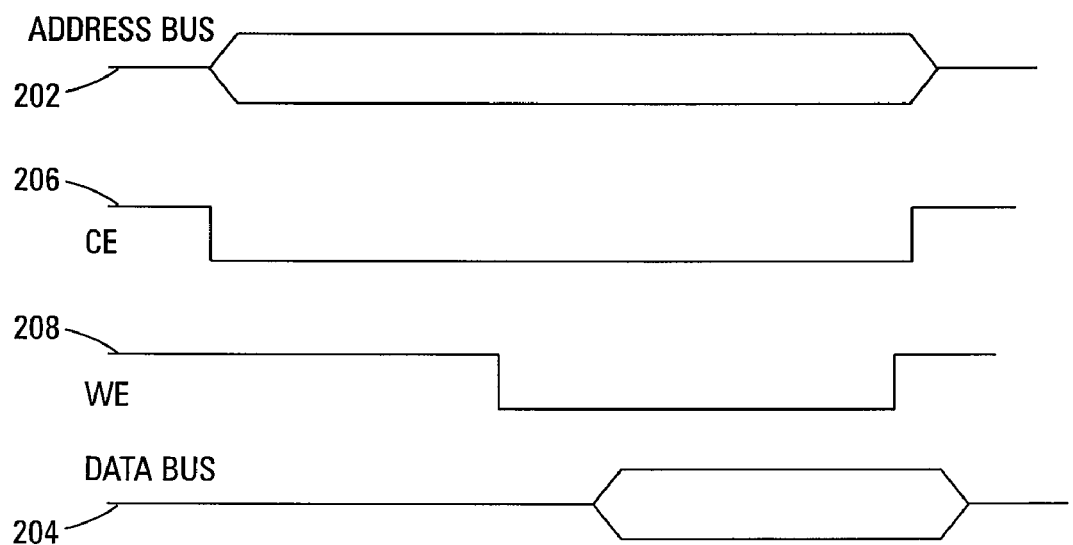
FIG. 2 details the signal timing of a data write operation of a Flash memory device.

FIG. 2 shows a simplified diagram of a typical Flash memory write command waveform 200 as output from the processor 102 across the communication bus 114 to a selected peripheral device. For discussion, Flash memory device 104 will be used as the enabled peripheral device. In FIG. 2, the Flash memory write command waveform 200, details an address bus waveform 202 representing the address placed on the address bus portion of the communication bus 114, having a plurality of address lines (not individually shown). A data bus waveform 204, representing the data placed on the data bus portion of the communication bus 114, having a plurality of data lines (not individually shown). An active low chip enable signal (CE) 206 and active low write enable signal (WE) 208 are also detailed. The formatting of the write command waveform 200 generally varies among Flash memory devices and is dependant upon its manufacturer's timing specifications.

During operation the CE signal 206 is first pulled low to select the Flash memory device 104. The address signal 202 is then placed on the address bus, typically row address first, followed by the column address (not shown). After a predetermined time period, typically specified by the row access latency of the Flash memory device 104, the WE signal 208 goes active low, generally at the same time that the column address is placed on the address bus, specifying that a write command is occurring. Once the column address has been specified and the write command given, the data to be written to the Flash memory device 104 is placed on the data bus 204. The time period between the WE command going active low and the data to be written being required to be valid on the data bus 204 is typically based on the column access latency of the Flash memory device. After the data signal 204 has been valid on the data bus for a specified hold time, the WE signal 208 and CE 206 signal are allowed to go inactive, with the WE signal 208 typically going inactive first, terminating the write command.

It is noted that the above example is for illustrative purposes and that other commands, signals, and data communications for memory devices, in particular Flash memory devices, are possible and would be apparent to those skilled in the art with benefit of the present disclosure.

Figure 3:
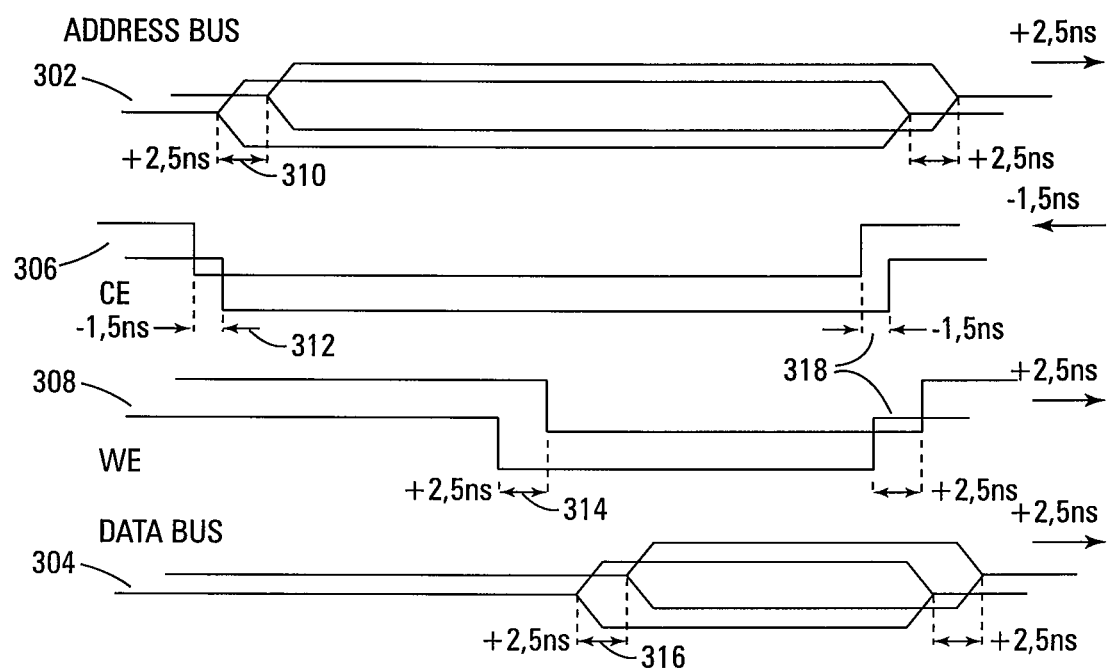
FIG. 3 details the signal timing of a data write operation of a Flash memory device as affected by capacitive and/or environmental delays.

FIG. 3 shows a simplified diagram of a typical Flash memory write command waveform 300 as affected by the signal line delays (due to voltage, layout, humidity, capacitance, or other environmental factors) of communication bus 114. In FIG. 3, the Flash memory write command waveform 300 details an address bus waveform 302, a data bus waveform 304, an active low chip enable signal (CE) 306, and active low write enable signal (WE) 308. Each of the address bus 302, data bus 304, CE 306, and WE 308 signals are shown as a superimposed upper and lower signal, where the lower signal is the signal as output onto the communication bus 114 and the upper signal is the signal as received from the communication bus 114 by the Flash memory device 104. The write command waveform 300 as output onto the communication bus 114 is formatted as required for the Flash memory device by its manufacturer's timing specifications. The time differences 310, 312, 314, 316 noted on FIG. 3 detail the signal delay on each individual signal as might be induced by environmental factors. In FIG. 3, the address bus 302 and data bus 304 are shown as being delayed 2.5 ns 310, 316. The CE 306 signal is shown as being delayed −1.5 ns 312 relative to where it should occur relative to the other signals and the WE signal delayed 2.5 ns 314, so that the WE signal 308 is active after the release of the CE signal 308, causing a timing violation 318 for the Flash memory device 104 for these signals. It is noted that the time delays of the address bus 310 and the data bus 316 may individually vary even though they are shown in FIG. 3 as being the same at 2.5 ns. It is also noted that the control signals of a device, such as the WE 308 and CE 306 signals, are generally more likely to be non-uniformly affected due to factors typical of control signals. These factors include, but are not limited to, non-uniform routing, the utilization of differing types of drivers and input buffers, layout consideration, signal voltage levels, and the requirement of reception by more than one peripheral device at the same time on the communication bus without the benefit of buffers that can be placed in high impedance input states.

Figure 4:
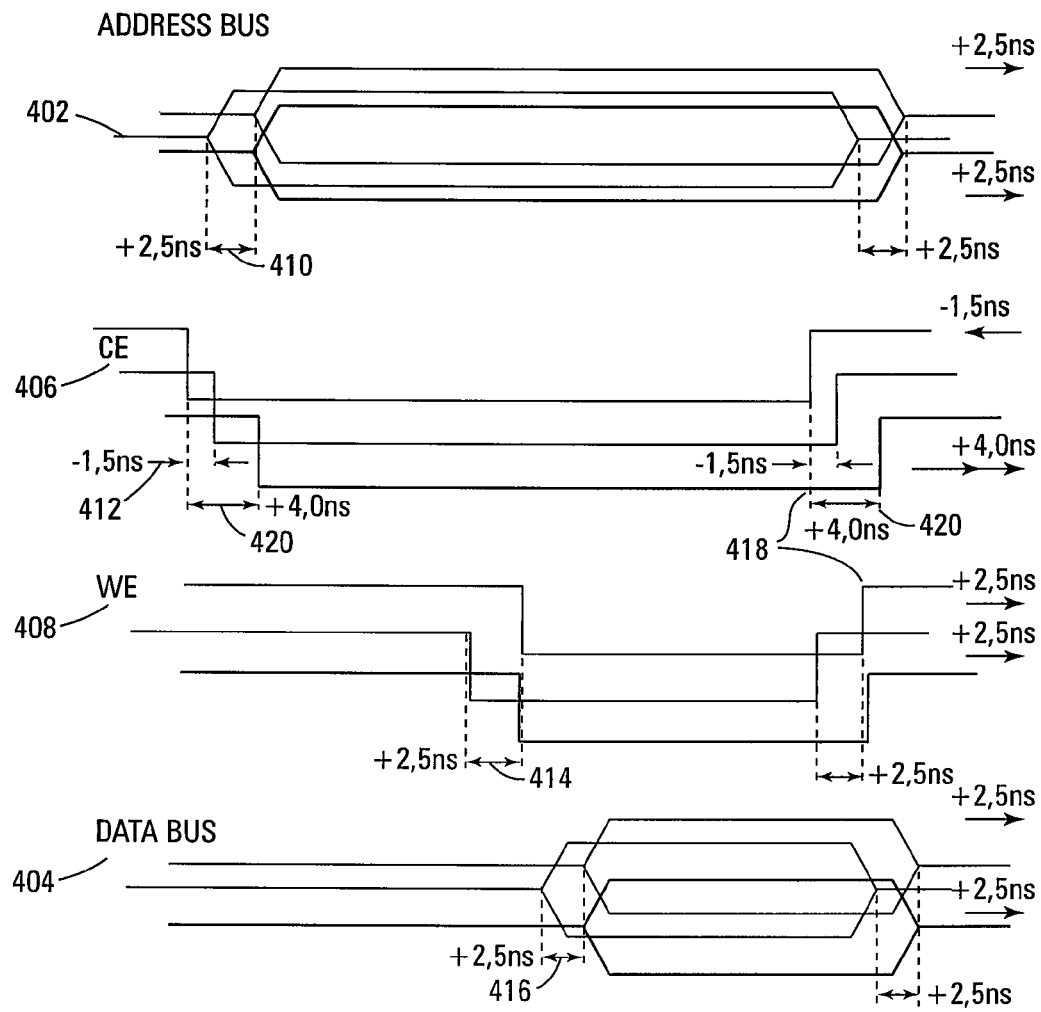
FIG. 4 details adjustment of capacitive and/or environmental delays of signals of a data write operation of a Flash memory device in accordance with embodiments of the present invention.

FIG. 4 shows a simplified diagram of a delayed Flash memory write command waveform 400 being corrected in an embodiment of the present invention. In FIG. 4, the Flash memory write command waveform 400 details an address bus waveform 402, a data bus waveform 404, an active low chip enable signal (CE) 406, and active low write enable signal (WE) 408. Each of the address bus 402, data bus 404, CE 406, and WE 408 signals are shown as a superimposed middle, upper, and lower signals. The middle signal represents the signal as output onto the communication bus 114; the upper signal is the signal as received from the communication bus 114 by the Flash memory device 104; and the lower signal represents the signal as corrected by a Flash memory device containing an embodiment of the present invention. The time differences noted on FIG. 4 between the upper and middle signals detail the signal delay 410, 412, 414, 416 on each individual signal as induced by environmental factors. As noted above in FIG. 3, the address bus 402 and data bus 404 are shown as being delayed 2.5 ns 410, 416, the CE 406 signal is shown as being delayed −1.5 ns 412, and the WE signal is shown as being delayed 2.5 ns 414 causing a timing violation 418.

In FIG. 4, the delay-affected signals are corrected to restore the relative timing and validity of the signals by selectively delaying one or more of the signals received from the communication bus 114 internally to the Flash memory device 104. In particular, in FIG. 4, the CE signal 406, as the signal that is affected by a negative signal delay, advancing it relative to the other signals, is delayed to correct the relative timing of the signals of the memory command/data from the communication bus 114. The time difference 420 noted on the corrected lower CE signal 408 shows the CE signal 408 being delayed 4.0 ns to correct for its induced −1.5 ns delay and the 2.5 ns delay of the other signal lines, bringing it into correct timing alignment.

Figure 5:
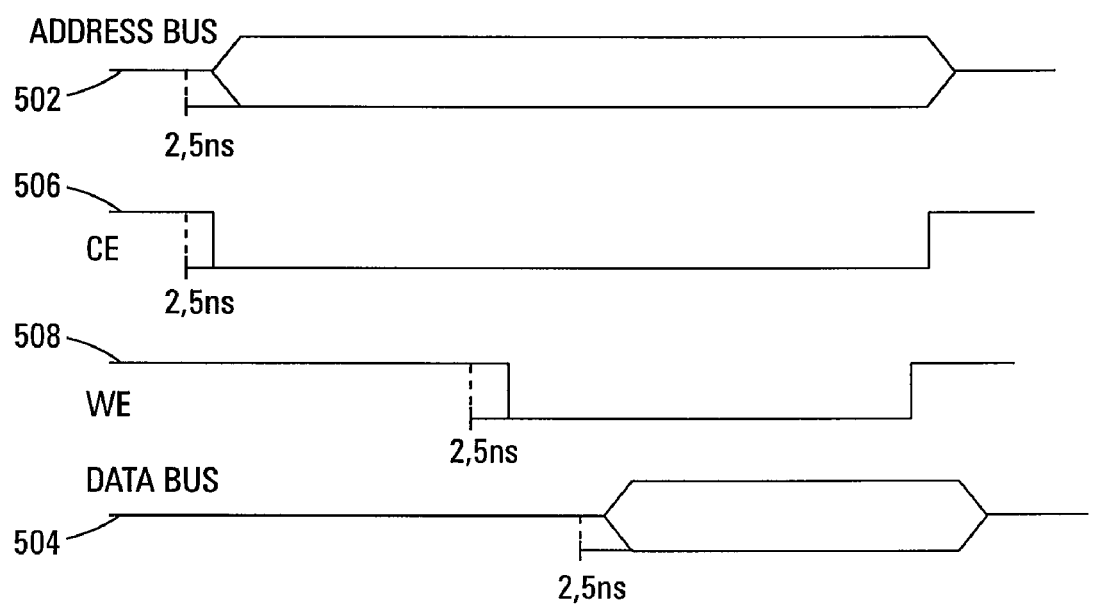
FIG. 5 details the adjusted signal timing of a data write operation of a Flash memory device in accordance with embodiments of the present invention.

FIG. 5 shows a simplified diagram of the restored internally received Flash memory write command waveform 500 as corrected by the selectively delayed interface of a Flash memory device embodiment of the present invention. In the corrected internal Flash memory write command waveform 500, an address bus waveform 502, a data bus waveform 504, an active low chip enable signal (CE) 506, and active low write enable signal (WE) 508 are shown. This delaying of selected signals at the interface/inputs of memory device embodiment of the present invention, as detailed in FIGS. 4 and 5, corrects the resultant command or data waveform. The corrected command or data waveform will still be delayed in its passage across the communication bus 114, for example, by an average of 2.5 ns in the Flash memory write command waveform 400, 500 of FIGS. 4 and 5. However, the corrected waveform 500 is still valid in its relative timing and allows for proper communication from a processor or memory controller 102 across a communication bus 114 to a Flash memory device embodiment of the present invention 104, as required for the Flash memory device by its manufacturer's timing specifications. In the above detailed example of FIGS. 3 to 5, input signals are adjustably delayed to correct relative signal timing and compensate for signal delay, it is noted that output signals from an interface of a device can be corrected by delay insertion before output in a similar fashion, although output delays are typically inverse to the inserted input delays, so that the system signal line delay is compensated for before the signals are placed on the signal lines of the communication bus 114.

In deciding which signal(s) of a communication interaction (command or data transaction) to correct by inserting input or output delays, multiple methods may be used by the system 100 or individual memory device 104. Such correction can be initiated at times that include, but are not limited to, power-up of the system 100, enabling or selection of the individual memory device 104, upon receiving a specialized command or signal, occurrence of a specific voltage or timing condition, occurrence of a timing failure, upon first insertion into the system 100, or on a continuous or periodic basis. The analysis and selection of which timing signals to correct may also occur in the memory device 104 or within the processor 102 and then loaded into the memory device 104 across the communication bus 114.

In one embodiment of the present invention, this analysis for correction selects a reference or base signal, which is typically an initial signal of the communication exchange. The relative timing of the other signals of the communication exchange/interaction as they are received at the memory device 104 are then analyzed in reference to this selected base signal to determine their relative delays and how close they are to their specified timing relation to the base reference signal. In analyzing the relative timing of signals, a counter may be utilized in some embodiments of the present invention to reference when signals occur and compare against internally recorded signal timing requirements. In one embodiment, the counter is incremented by a clock signal reference and begins counting upon the reception of a base reference signal, such as an initial signal of a communication exchange. From this timing analysis, the signals that need correction are selected by comparing the measured timing against the specified signal timing requirements of the device to find the deviation of the signal from the specified timing requirements. The required delays are then inserted automatically to all adjustable signal inputs or, in an alternative embodiment, the signal delays are only inserted upon the signal deviation reaching a threshold level of deviation from the specified timing. In one embodiment, the memory device or other timing analyzer (such as an external processor) keeps a running average of the measured signal delays of each signal to smooth the measured delays and provide a better measure of actual signal delays and the selection of the inserted signal delays.

In another embodiment of the present invention, the analysis starts by selecting the most delayed signal of a communication exchange and analyzing the relative timing of the other signals in relation to it to determine the required delays to be inserted to correct the communication exchange and restore the relative timing of the signals. In this type of analysis, the communication exchange selected to be analyzed is preferably one with a failing timing relationship, one with a more critical timing relationship for proper system or memory device operation, or one that is a more commonly utilized exchange, so as to correct the widest or most critical communication interactions. However, any communications exchange can be utilized for the analysis.

Other timing analysis and correction methods utilizing embodiments of the present invention should be apparent to those skilled in the art with the benefit of the present disclosure.

In inserting the correcting delays into signals at the input or output of an interface of an integrated circuit or memory device, delay elements can be utilized and selectively inserted into the signal propagation path internal to the device. Some common types of circuit elements that can be utilized as delays include, but are not limited to, Schmidt triggers, buffers, inverters, resistive-capacitive (RC) elements, and delay lines with selective signal taps. These delay elements are typically sequentially coupled and selectively inserted into the selected signal input or output propagation path. The delay elements on differing signal inputs or outputs in embodiments of the present invention can also be implemented with differing delays/granularities, depending on the sensitivity of the signal to relative delay and/or its relative timing to other signals or events. In one embodiment of the present invention, staged delay blocks containing delay elements of differing delay time granularity can also be utilized to allow for coarse and fine input delay adjustment. It is noted that other embodiments of the present invention utilizing alternative delay elements and arrangements thereof are possible and should be apparent to those skilled in the art with the benefit of the present disclosure.

Shown in FIGS. 6A-6D are examples of delay elements, such as would typically be used in the input or output circuits of embodiments of the present invention to delay signals for a given time period. These delay elements are utilized in embodiments of the present invention to delay the signals transitioning through the input or output circuit and allow the input or output circuit to correct the relative signal timing of a communication interaction, as detailed herein. The delay element in FIG. 6A comprises an inverter gate 600. The delay element in FIG. 6B comprises a buffer 602. The delay element in FIG. 6C comprises a RC circuit 604 with a resistor 608 coupled to an inverter 610 and to a capacitor 612, where the capacitor 612 is coupled to a power rail or to circuit ground. The delay element in FIG. 6D comprises a Schmitt trigger 606. Additional delay element structures or gate delays that could be utilized, such as, skew limited delays, and etc., will be apparent to those skilled in the art with the benefit of the present specification.

It is noted that each of the delay elements 600, 602, 604, and 606 of FIGS. 6A-6D can be coupled in series of multiple similar or differing delay elements to affect a longer delay if so desired. In one embodiment of the present invention, the delay elements are selectively coupled in series in the input or output circuit to affect the desired amount of signal delay.

FIG. 7A details an input circuit 700 of one embodiment of the present invention. In FIG. 7A, an input signal is selectively coupled directly from an input 704 to an output 706 or through a delay element 702 by the operation of the input circuit 700 under control of a select delay signal 708. In the input circuit 700, the input 704 is coupled a first and second signal pass gates 710, 712. The first signal pass gate 710 is coupled to the output 706 and couples the signal from the input 704 to the output 706 when activated. The output of the second signal pass gate 712 is coupled to the delay element 702, where the output of the delay element 702 is coupled to the output 706. The second signal pass gate 712 couples the signal from the input 704 to the output 706 through the delay element 702 when activated.

The select delay signal 708 controls the operation of the first and second signal pass gates 710, 712 both directly and in combination with inverter 714. The select delay signal 708 is directly coupled to inverter 714, the inverting gate of the first signal pass gate 710, and to the non-inverting gate of the second signal pass gate 712. The output of the inverter 714 is coupled to the non-inverting gate of the first signal pass gate 710 and to the inverting gate of the second signal pass gate 712. In operation, a logical zero signal (low) expressed on the select delay signal line 708 deactivates the inverting and non-inverting gates of the second signal pass gate 712 and activates the inverting and non-inverting gates of the first signal pass gate 710, coupling the incoming signal from the input 704 to the output 706 and blocking signal propagation through the delay element 702. A logical one signal (high) expressed on the select delay signal line 708 activates the inverting and non-inverting gates of the second signal pass gate 712 and deactivates the inverting and non-inverting gates of the first signal pass gate 710, coupling the incoming signal from the input 704 though the delay element 702 to the output 706 and blocking direct signal propagation from the input 704 to the output 706 through the first signal pass gate 710.

FIG. 7B details an input circuit 720 of another embodiment of the present invention that utilizes delay line with selective signal taps. In FIG. 7B, a series of delay elements 726 are coupled into a sequential chain to form a delay line 744. An input signal is coupled from the input 722 and propagates through each of the delay elements 726 in the sequence of the delay line 744. A number of signal pass gates, 728, 732, 736, and 740, act as signal taps on the delay line 744 and allow the input signal to be sampled and coupled to the output 724 at each point along the delay line 744; from before the start of the delay line 744, from between each pair of delay elements 726, and at the end of the delay line 744. This allows the input circuit 720 of FIG. 7B to selectively delay the input signal from 0 to 3 delay elements 726 worth of time delay.

Each signal pass gate 728, 732, 736, 740 is coupled to a select line (SELECT0 730, SELECT1 734, SELECT2 738, and SELECT3 742) to allow the integrated circuit the input circuit 722 is a part of select the amount signal delay desires to be inserted. Each select line 730, 734, 738, 742 is coupled to the non-inverting gate directly and the inverting gate indirectly through an inverter 746 of its respective signal pass gate 728, 732, 736, 740.

It is noted that each delay element 726 need not have the same time delay in the input circuit 720 of FIG. 7B. In addition, it is also noted that two of more of the input circuits 700 and 720 may be serially combined utilizing differing time delay elements 702, 726 to allow for fine and coarse time delay adjustment.

Figure 7C:
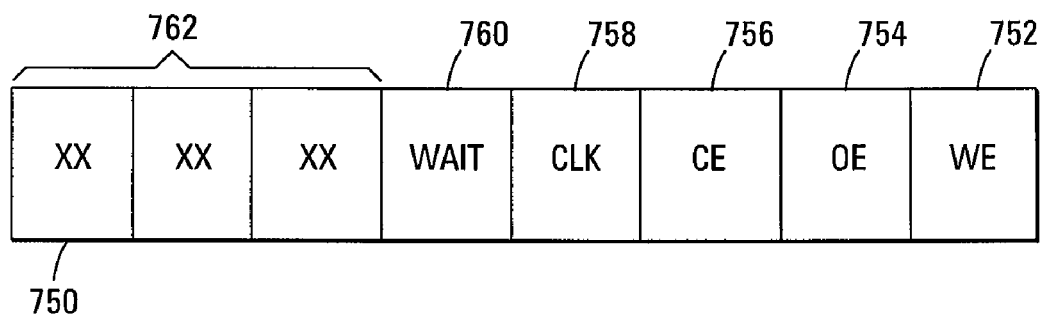

FIG. 7C details a delay control/timing reconstruction register 750 of one embodiment of the present invention for selectively delaying inputs of a memory device. In FIG. 7C, an internal register 750 of the memory is shown having register entries for each input signal that has an adjustable input delay in the memory device. Register entries are shown in the delay control register 750 for CE 756, output enable (OE) 754, WE 752, clock (CLK) 758, and WAIT 760. Additional register entries 762 can also be defined for other inputs to the memory device. In the delay control register 750 of FIG. 7C, to insert the desired 4 ns delay into the CE signal 406 of FIG. 4 to correct the write command waveform 400, the CE register entry 756 might contain a value of "2" or binary "10." This would indicate to the memory device to insert two Schmidt trigger delay elements having a delay of 2 ns each into the signal path of the CE signal input to delay it 4 ns. The values of the delay control register 750, in one embodiment of the present invention, would be each be coupled either directly or through a multiplexer to one or more of the input circuits 700, 720 of FIGS. 7A and 7B to operate the select lines 708, 730, 734, 738, 742 and insert the desired amount of time delay to some or all of the adjustable inputs. It is noted that in memory embodiments of the present invention that the signals CLK 758 and WAIT 760 are often included as entries in the delay control/timing reconstruction register 750 due to their importance for operation and the overall variability in the signals caused by the variety of controlling processors and/or memory controllers. It is also noted that the register of FIG. 7C may also be utilized to control output signal delays. It is further noted that other delay control methods and apparatus utilizing embodiments of the present invention are possible and should be apparent to those skilled in the art with the benefit of the present invention.

Figure 8:
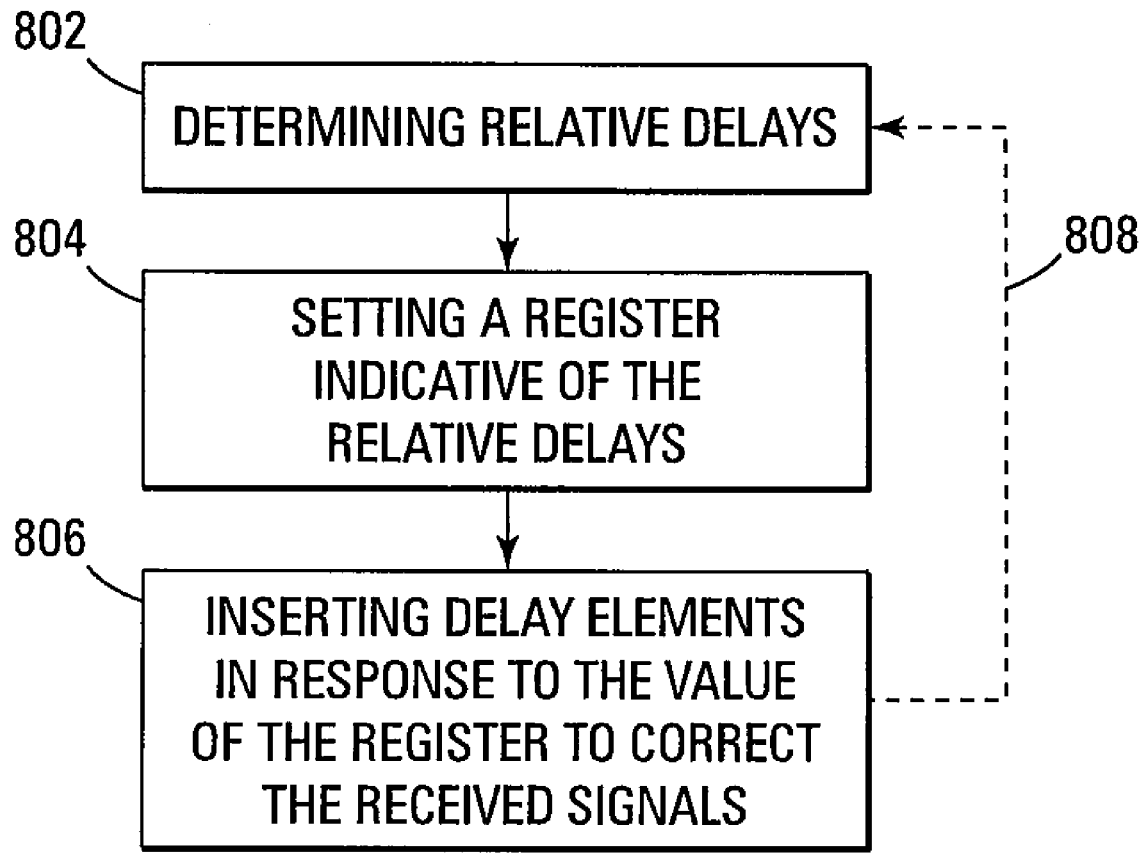
FIG. 8 details a flowchart of a signal delay adjustment in accordance with embodiments of the present invention.

FIG. 8 details a flowchart 800 of the operation of one embodiment of the present invention. In FIG. 8, an integrated circuit or memory device of one embodiment of the present invention determines the relative delays 802 of one or more input and/or output signals at an interface. After the relative timing delays are determined a register is set that is indicative of the relative delays 804. In response to the values set in the register delay elements are inserted into the inputs and/or outputs to correct the signals 806. In one embodiment of the present invention, the method detailed in FIG. 8 then loops 808 and repeats to allow for a continually adjusting relative delay correction.

It is noted that the timing reconstruction detailed in FIGS. 3 to 8 is for illustration purposes and that other timing reconstruction of differing signals, communication commands/data, and implementations are possible.

Figure 9:
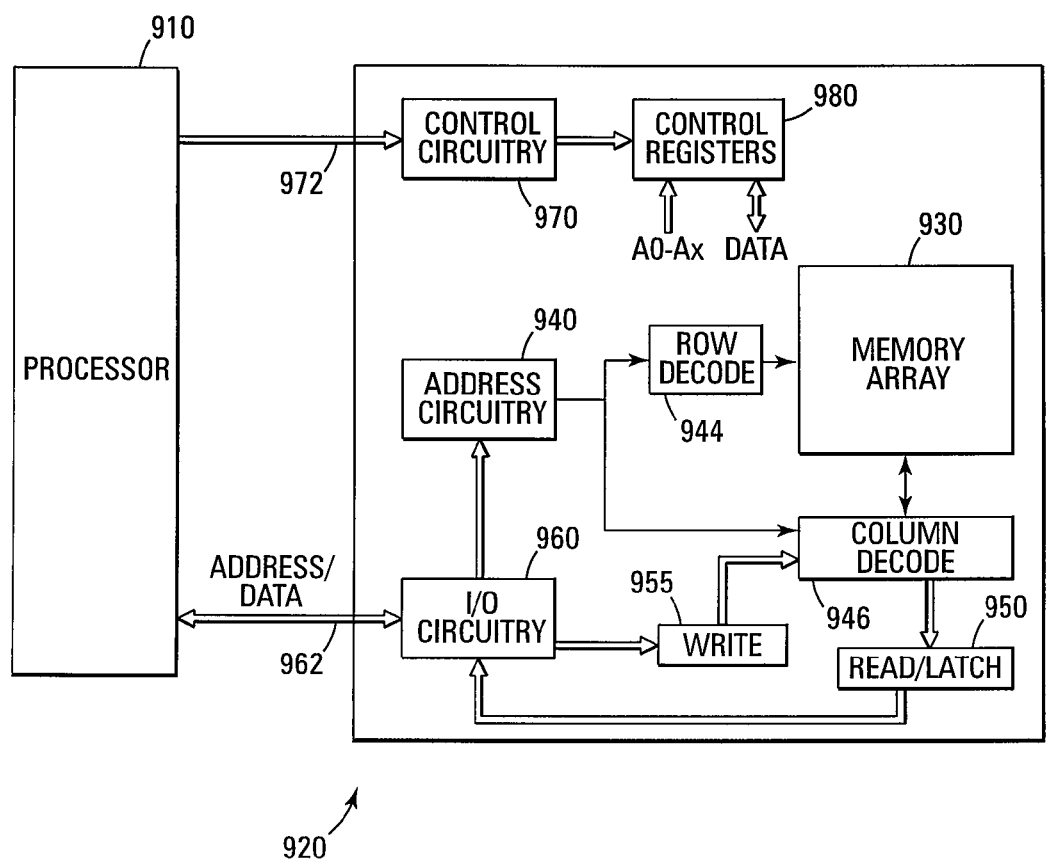
FIG. 9 details a block diagram of an electronic system in accordance with embodiments of the present invention.

FIG. 9 illustrates a functional block diagram of a memory device 900 that can incorporate the selective input and/or output delays, methods, and control circuitry of the present invention. The memory device 900 is coupled to a processor 910. The processor 910 may be a microprocessor or some other type of controlling circuitry. The memory device 900 and the processor 910 form part of an electronic system 920. The memory device 900 has been simplified to focus on features of the memory that are helpful in understanding the present invention.

The memory device includes an array of floating gate memory cells and select gates 930. In one embodiment, the memory cells are floating gate memory cells and the memory array 930 are arranged in banks of rows and columns. The control gates of each row of memory cells are coupled with a wordline while the drain and source connections of the memory cells are coupled to bitlines and source lines, respectively.

An address buffer circuit 940 is provided to latch address signals provided on address/data bus 962. Address signals are received and decoded by a row decoder 944 and a column decoder 946 to access the memory array 930. It will be appreciated by those skilled in the art, with the benefit of the present description, that the size of address input on the address/data bus 962 depends on the density and architecture of the memory array 930. That is, the size of the input address increases with both increased memory cell counts and increased bank and block counts. It is noted that other address input manners, such as through a separate address bus, are also known and will be understood by those skilled in the art with the benefit of the present description.

The memory device 900 reads data in the memory array 930 by sensing voltage or current changes in the memory array columns using sense/buffer circuitry 950. The sense/buffer circuitry, in one embodiment, is coupled to read and latch a row of data from the memory array 930. Data input and output buffer circuitry 960 is included for bidirectional data communication over a plurality of data connections in the address/data bus 962 with the processor/controller 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller.

The memory device illustrated in FIG. 9 has been simplified to facilitate a basic understanding of the features of the memory. A more detailed understanding of internal circuitry and functions of memories are known to those skilled in the art.

It is noted that the input signal checking and correction via delay elements of memory embodiments of the present invention can apply to other volatile and non-volatile memory types including, but not limited to, SDRAM, DDR, dynamic RAM, static RAM, ROM, EEPROM, Flash memory, polymer memory, FeRAM, OUM, NROM, and MRAM and should be apparent to those skilled in the art with the benefit of the present invention.

It is also noted that other input or output signal delays, correction sequences, and circuits in integrated circuit or memory embodiments of the present invention are possible and should be apparent to those skilled in the art with benefit of the present disclosure.

CONCLUSION

Improved integrated circuits, memory devices, circuitry, and data methods have been described that facilitate the adjustment and reconstruction of signal timing of devices by providing for an interface having inputs and/or outputs that are adjustably delayed. This allows embodiments of the present invention to sense the signal delay and utilize adjustable input or output delays to correct the signal timing relationships such that correctly timed communication signals are received or transmitted by the internal circuitry of the device. In one embodiment of the present invention, a register is utilized to adjust the timing delay of individual input and/or output signals for the device. This increases the robustness of the device and its resistance to communication or data corruption, allowing larger ranges of environmental conditions and input capacitances of systems or communication busses to be tolerated.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating an integrated circuit comprising:
   receiving a plurality of signals on an interface having a plurality of signal lines; and
   selectively adjusting one or more signal lines of the plurality of signal lines by delaying the signals received on the one or more signal lines, wherein the signals are delayed utilizing delay elements in the one or more signal lines.

2. The method of claim 1, wherein the integrated circuit is a memory device.

3. The method of claim 1, wherein the interface is a synchronous interface.

4. The method of claim 1, wherein selectively adjusting one or more signal lines of the plurality of signal lines by delaying the signals received on the one or more signal lines further comprises correcting the relative timing of signals in the plurality of signals by inserting delays in the one or more signal lines.

5. The method of claim 1, wherein selectively adjusting one or more signal lines of the plurality of signal lines by delaying the signals received on the one or more signal lines further comprises inserting one or more selectively coupleable delay elements into the one or more signal lines.

6. The method of claim 5, wherein the one or more selectively coupleable delay elements are one of a Schmidt trigger, a buffer element, an inverter, a RC delay, and a delay line with taps.

7. The method of claim 1, further comprising loading the integrated circuit with delay corrections from an external source to correct delays in the plurality of signal lines in the interface.

8. The method of claim 1, further comprising:
   detecting signal delays in the plurality of signal lines.

9. A method of operating an integrated circuit comprising:
   receiving a plurality of signals on an interface having a plurality of signal lines;
   selectively adjusting one or more signal lines of the plurality of signal lines by delaying the signals received on the one or more signal lines: and
   detecting signal delays in the plurality of signal lines;
   wherein detecting signal delays in the plurality of signal lines further comprises measuring the time delay of one or more signals of the plurality of signals from the occurrence of a reference signal to the occurrence of each of the one or more signals.

10. The method of claim 9, wherein measuring the time delay of one or more signals of the plurality of signals from the occurrence of a reference signal to the occurrence of each of the one or more signals further comprises timing the one or more signals of the plurality of signals with a counter initiated in response to the reference signal.

11. The method of claim 9, further comprising:
   comparing the observed timing of the one or more signals to a specified stored value or specified range of values for each signal.

12. The method of claim 9, further comprising:
   comparing the measured times of two signals of the one or more signals to obtain a relative timing difference and comparing the relative timing difference to a stored value or value range for the two signals.

13. The method of claim 1, wherein the one or more signal lines are one of input signal lines, output signal lines, and bi-directional signal lines.

14. The method of claim 1, further comprising selectively delaying the one or more signal lines of the plurality of signal lines by delaying transmitted signals from the integrated circuit inversely to the delay placed on received signals on bi-directional lines.

15. A method of operating an integrated circuit comprising:
   selectively adjusting one or more signal lines of a plurality of signal lines of an interface by inserting delays to delay a subset of signals of a plurality of signals to be transmitted on the plurality of signal lines; and
   transmitting the plurality of signals on the interface.

16. The method of claim 15, wherein selectively adjusting one or more signal lines of a plurality of signal lines of an interface by inserting delays to delay a subset of signals of a plurality of signals to be transmitted on the plurality of signal lines further comprises inserting delays in the subset of signal lines to compensate for external signal delays in the plurality of signals.

17. The method of claim 15, wherein selectively adjusting one or more signal lines of a plurality of signal lines of an interface by inserting delays to delay a subset of signals of a plurality of signals to be transmitted on the plurality of signal lines further comprises inserting one or more selectively coupleable delay elements into the subset of signal lines.

18. The method of claim 15, wherein the transmitted signals of the subset of signal lines are delayed inversely to the delay detected on received signals.

19. A method of operating a memory device comprising:
receiving a plurality of signals on an interface having a plurality of signal lines; and
selectively adjusting one or more signal lines of the plurality of signal lines by delaying the signals received on the one or more signal lines wherein the signals are delayed utilizing delay elements in the one or more signal lines.

20. The method of claim 19, wherein the memory device is a non-volatile memory device.

21. The method of claim 19, wherein the interface is a synchronous interface.

22. The method of claim 21, wherein the synchronous interface is one of a SDRAM, and a DDR.

23. The method of claim 19, wherein selectively adjusting one or more signal lines of the plurality of signal lines by delaying the signals received on the one or more signal lines further comprises correcting the relative timing of signals in the plurality of signals by inserting delays in the one or more signal lines.

24. The method of claim 19, wherein selectively adjusting one or more signal lines of the plurality of signal lines by delaying the signals received on the one or more signal lines further comprises inserting one or more selectively coupleable delay elements into the one or more signal lines.

25. The method of claim 24, wherein the one or more selectively coupleable delay elements are one of a Schmidt trigger, a buffer element, an inverter, a RC delay, and a delay line with taps.

26. The method of claim 19, further comprising loading the memory device with delay corrections from an external or internal source to correct delays in the plurality of signal lines in the interface.

27. The method of claim 26, wherein loading the memory device with delay corrections from an external or internal source to correct delays in the plurality of signal lines in the interface further comprises loading the delay corrections into an internal register.

28. The method of claim 19, further comprising:
detecting signal delays in the plurality of signal lines.

29. A method of operating a memory device comprising:
receiving a plurality of signals on an interface having a plurality of signal lines;
selectively adjusting one or more signal lines of the plurality of signal lines by delaying the signals received on the one or more signal lines; and
detecting signal delays in the plurality of signal lines;
wherein detecting signal delays in the plurality of signal lines further comprises measuring the time delay of one or more signals of the plurality of signals from the occurrence of a reference signal to the occurrence of each of the one or more signals.

30. The method of claim 29, wherein measuring the time delay of one or more signals of the plurality of signals from the occurrence of a reference signal to the occurrence of each of the one or more signals further comprises timing one or more signals of the plurality of signals with a counter.

31. The method of claim 29, further comprising:
comparing the observed timing of the one or more signals to a specified stored value or specified range of values for each signal.

32. The method of claim 29, further comprising:
comparing the measured times of two signals of the one or more signals to obtain a relative timing difference and comparing the relative timing difference to a stored value or value range for the two signals.

33. The method of claim 19, wherein selectively adjusting one or more signal lines of the plurality of signal lines by delaying the signals received on the one or more signal lines further comprises selectively adjusting one or more signal lines of the plurality of signal lines by delaying the signals received on the one or more signal lines, wherein the one or more signal lines are one of input signal lines, output signal lines, and bi-directional signal lines.

34. The method of claim 33, wherein selectively adjusting one or more signal lines of the plurality of signal lines by delaying the signals received on the one or more signal lines, wherein the one or more signal lines are one of input signal lines and bi-directional signal lines further comprises selectively delaying the one or more signal lines of the plurality of signal lines by delaying transmitted signals from the integrated circuit inversely to the delay placed on received signals.

35. The method of claim 19, wherein the memory device is a memory system, the memory system comprising, a memory controller, and one or more coupled memory devices.

36. A method of correcting signal line delay comprising:
receiving a plurality of signals at an interface; and
selectively delaying one or more signals of the plurality of signals, wherein the signals are delayed utilizing one or more delay elements coupled to the interface.

37. The method of claim 36, wherein selectively delaying one or more signals of the plurality of signals further comprises compensating for delay on the plurality of signals.

38. The method of claim 37, wherein compensating for delay on the plurality of signals further comprises compensating for capacitively induced delay on the plurality of signals.

* * * * *

UNITED STATES PATENT AND TRADEMARK OFFICE
CERTIFICATE OF CORRECTION

PATENT NO.       : 7,453,746 B2
APPLICATION NO.  : 11/677429
DATED            : November 18, 2008
INVENTOR(S)      : Ivanov Page 1 of 1

It is certified that error appears in the above-identified patent and that said Letters Patent is hereby corrected as shown below:

On the Title page, in field (30), under "Foreign Application Priority Data", in column 1, line 1, delete "10 2004 015 868" and insert -- 10 2004 015 868.1 --, therefor.

In column 12, line 18, in Claim 9, delete "lines:" and insert -- lines; --, therefor.

Signed and Sealed this

Third Day of March, 2009

JOHN DOLL
*Acting Director of the United States Patent and Trademark Office*